(12) United States Patent
Melvin, III et al.

(10) Patent No.: US 7,727,687 B2
(45) Date of Patent: Jun. 1, 2010

(54) METHOD AND APPARATUS FOR DETERMINING WHETHER A SUB-RESOLUTION ASSIST FEATURE WILL PRINT

(75) Inventors: Lawrence S. Melvin, III, Hillsboro, OR (US); Jensheng Huang, San Jose, CA (US); Martin Drapeau, Ottawa (CA)

(73) Assignee: Synopsys, Inc., Mountain View, CA (US)

( * ) Notice: Subject to any disclaimer, the term of this patent is extended or adjusted under 35 U.S.C. 154(b) by 866 days.

(21) Appl. No.: 11/454,439

(22) Filed: Jun. 15, 2006

(65) Prior Publication Data

US 2007/0292777 A1    Dec. 20, 2007

(51) Int. Cl.
*G03F 9/00*     (2006.01)

(52) U.S. Cl. .......................................... 430/30; 382/145
(58) Field of Classification Search ................... 430/30; 382/145
See application file for complete search history.

*Primary Examiner*—Christopher G Young
(74) *Attorney, Agent, or Firm*—Park, Vaughan & Fleming LLP

(57) ABSTRACT

One embodiment of the present invention provides a system that determines whether a sub-resolution assist feature will print. During operation, the system receives a layout which contains a sub-resolution assist feature. Next, the system determines whether the sub-resolution assist feature will print using a process model and the layout. The process model is determined using first process data and second process data. The first process data is obtained using a first layout which is exposed using a first exposure level. The second process data is obtained using a second layout which is exposed using a second exposure level, which is different from the first exposure level. The second exposure level causes the sub-resolution assist features within the second layout to print.

12 Claims, 3 Drawing Sheets

METHOD AND APPARATUS FOR DETERMINING WHETHER A SUB-RESOLUTION ASSIST FEATURE WILL PRINT

BACKGROUND

1. Field of the Invention

The present invention relates to semiconductor design and manufacturing. More specifically, the present invention relates to a method and apparatus for determining whether a sub-resolution assist feature will print.

2. Related Art

Dramatic improvements in semiconductor manufacturing technologies presently make it possible to integrate tens of millions of devices onto a single chip.

Semiconductor manufacturing technologies typically include a number of processes which involve complex physical and chemical interactions. Since it is almost impossible to find exact formulae to predict the behavior of these complex interactions, researchers typically use process models which are fit to empirical data to predict the behavior of these processes. A process model can be used in a number of applications during the design of a semiconductor chip. For example, process models are commonly used for making corrections to layouts to compensate for undesirable effects of semiconductor manufacturing processes.

One of the important steps in semiconductor manufacturing involves placing assist features in a layout. Assist features (AFs) can be printing (e.g., super-resolution assist features) or non-printing (e.g., sub-resolution assist features). In either case, assist features are meant to improve the depth of focus of the layout.

The larger the SRAF (sub-resolution assist feature), the more effective the SRAF will be in improving a pattern's manufacturing robustness. However, larger SRAFs are also more likely to print on a wafer. Hence, to determine the optimal SRAF width, we need to accurately predict when an SRAF will print.

Unfortunately, process models created using prior art techniques usually cannot accurately predict when an SRAF will print. As a result, foundries typically use very conservative SRAF widths (i.e., overly thin SRAFs) everywhere on the wafer, thereby forfeiting the advantages of using SRAFs.

Hence, what is needed is a method and an apparatus for accurately determining whether a sub-resolution assist feature will print.

SUMMARY

Embodiments of the present invention can be used to determine whether a sub-resolution assist feature will print. During operation, the system receives a layout which contains a sub-resolution assist feature. Next, the system determines whether the sub-resolution assist feature will print using a process model and the layout.

In contrast to prior art techniques, embodiments of the present invention determine a process model using empirical data that is generated using multiple exposure levels. This allows the process model to accurately model the optical intensity in the proximity of SRAFs at exposure levels at which the SRAFs usually do not print. In contrast, prior art techniques do not accurately model the optical intensity in the proximity of SRAFs at exposure levels at which the SRAFs usually do not print.

In the present invention, the process model can be determined using first process data and second process data. The first process data can be obtained using a first layout which is exposed using a first exposure level. Specifically, the first process data can be obtained by measuring the critical dimensions of features on a wafer which is processed using the first layout.

The second process data can be obtained using a second layout which is exposed using a second exposure level, which is different from the first exposure level. In particular, the second exposure level can cause the sub-resolution assist features within the second layout to print. Note that the second process data can be obtained by measuring the critical dimensions of sub-resolution assist features on a wafer which is processed using the second layout.

Once the empirical data is obtained, the process model can be determined by first determining a ratio between the first exposure level and the second exposure level. The process model can then be fitted to the first process data and the second process data using the ratio. Specifically, the system can fit the process model to the empirical data by adjusting data values in the second process data using the ratio.

DETAILED DESCRIPTION

Integrated Circuit Design Flow

Figure 1:
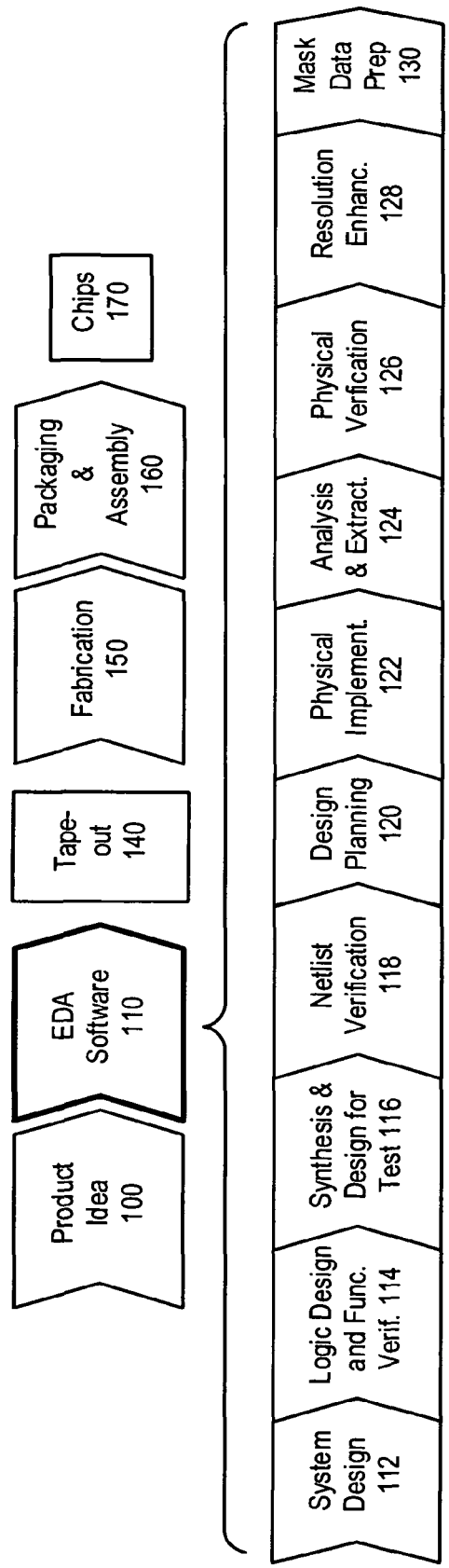
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process starts with the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. The following design flow description is for illustration purposes only. This description is not meant to limit the present invention. For example, an actual integrated circuit design may require the designer to perform the design steps in a different sequence than the sequence described below.

System design (step 112): The designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): Placement and routing occurs at this step. Exemplary EDA software products from Synopsys, Inc. that can be used at this step include the Astro and IC Compiler products.

Analysis and extraction (step 124): At this step, the circuit function is verified at a transistor level, which also permits what-if refinement. Exemplary EDA software products from Synopsys, Inc. that can be used at this step include AstroRail, PrimeRail, Primetime, and Star RC/XT products.

Physical verification (step 126): In this step, the design is checked to ensure correctness for manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks to produce finished chips. Exemplary EDA software products from Synopsys, Inc. that can be used at this step include the CATS(R) family of products.

Embodiments of the present invention can be used during one or more of the above described steps. Specifically, one embodiment of the present invention can be used during the resolution enhancement step 128.

Process Models

A process model models the behavior of one or more semiconductor manufacturing processes which typically involve complex physical and chemical interactions. For example, a process model can model a photolithography process and the subsequent etch processes. A process model is usually determined by fitting or calibrating the process model to empirical data which is obtained using a test layout. Once a process model is determined, it can be used for a number of purposes during the design of a semiconductor chip. For example, process models are commonly used for making corrections to layouts to compensate for undesirable effects of semiconductor manufacturing processes.

A process model typically comprises functions which contain parameters which need to be statistically fit to empirical data. Let's consider an example of how a function can be fit to empirical data. Let the function be $f(x; \lambda_1, \lambda_2, \ldots, \lambda_n)$, where x is a variable (note that x can be a vector) and $\lambda_1, \lambda_2, \ldots, \lambda_n$ are n unknown parameters that are used in the function and which need to be fit to empirical data. Further, let the empirical data contain m values, $y_1 = f(x_1), y_2 = f(x_2), \ldots, y_m = f(x_m)$. Note that each empirical data-point imposes a constraint on the parameters of the process model, namely, that the process model must return value $y_i$ when it is given input $x_i$. Ideally, we want to determine the parameter values $\lambda_1, \lambda_2, \ldots, \lambda_n$, which will perfectly match the empirical data, i.e., the parameter values will result in a function that will exactly satisfy the constraints $y_1 = f(x_1), y_2 = f(x_2), \ldots, y_m = f(x_m)$. However, in many situations, an exact fit is not possible. Hence, fitting the process model to the empirical data typically involves using statistical fitting techniques to determine the parameter values $\lambda_1, \lambda_2, \ldots, \lambda_n$ which will result in the minimum error between the empirical data values and the data values generated by the process model. Specifically, the system can use a non-linear least-squares fitting technique to determine the parameter values.

Empirical Data

The empirical data is usually generated by applying the semiconductor manufacturing processes that are being modeled to a test layout. For example, an optical lithography process can be used to print a test layout on a wafer. Next, the empirical data can be generated by measuring the critical dimensions (CD) of features before and/or after etch. The process model can then be fit to the empirical data to determine a process model that models the photolithography process.

Optical Intensity and Threshold

In one embodiment, the process model can comprise an optical intensity component, a statistical component, and a threshold. The optical intensity component models the optical intensity at a location on a wafer which is coated with photoresist, whereas the threshold models the sensitivity of the photoresist. The statistical component can be used to model process effects which are not captured by the optical intensity component or the threshold. For example, the statistical component can be used to model the etch process.

One or more components in the process model may be normalized. Specifically, in one embodiment, the optical intensity component is normalized. For example, in one embodiment, regardless of the exposure level, the optical intensity values are always between 0 and 1.

The shape of a feature on the wafer can be determined by first using the optical intensity component and the statistical component to determine an "effective optical intensity" value at a number of locations on the wafer, and then by comparing this "effective optical intensity" value with the threshold to determine a contour. This technique can also be used for determining whether the feature will print or not.

Note that different applications may use different criteria to define what it means for a feature to "print." For example, a feature may be deemed to "print" even if it forms a scum on the substrate which will eventually be etched away. On the other hand, a feature may be deemed to "print" only if it survives etch and appears on the substrate.

Assist Features

Sub-resolution assist features (SRAFs) are an effective way to improve through-process robustness (or depth of focus) of layout patterns by increasing the use of spatial frequency components on the target pattern that are largely insensitive to variations in focus condition. Corresponding increases in process margin can increase wafer yield and help to stretch existing technology to smaller process nodes.

Figure 2:
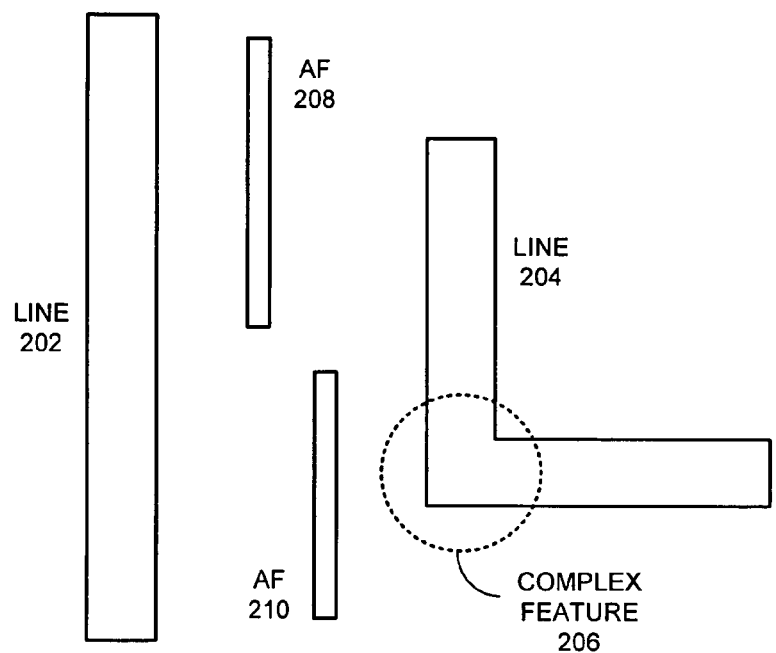
FIG. 2 illustrates assist feature placement in a mask layout in accordance with an embodiment of the present invention.

FIG. 2 illustrates assist feature placement in a mask layout in accordance with an embodiment of the present invention.

Lines 202 and 204 are part of a mask layout. Assist feature placement and/or dimensioning is usually more challenging when a layout contains complex features. For example, due to the complex feature 206, we may need to place two assist features 208 and 210 that are staggered, instead of just one assist feature. A layout that has multiple lines with varying pitches is another example of a complex layout.

Assist features can be placed using rule tables that dictate the assist feature placement and dimensioning based on combinations of feature width and spacing parameters.

Figure 3:
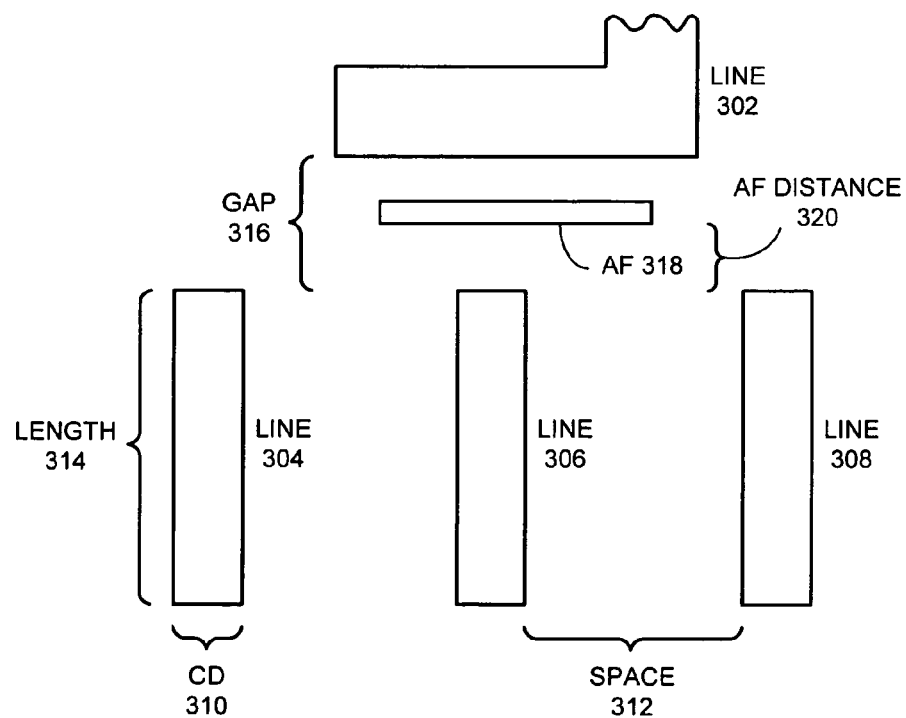
FIG. 3 illustrates assist feature placement using mask rules in accordance with an embodiment of the present invention.

FIG. 3 illustrates assist feature placement using mask rules in accordance with an embodiment of the present invention.

Lines 302, 304, 306, and 308 are part of a mask layout. In a rule-based approach, assist feature (AF) 318 placement/dimensioning can depend on a variety of factors which are organized in the form of a rule table. For example, the AF distance 320 can be determined based on a rule table that includes a variety of factors, such as, the critical dimension (CD) 310, space 312, length 314, and gap 316.

Unfortunately, prior art techniques for determining the appropriate size of an SRAF severely limit the use of SRAFs. Note that the larger the SRAF, the more effective the SRAF is in helping to improve a pattern's manufacturing robustness. However, the larger the SRAF, the more likely the SRAF is to print on a wafer. Consequently, foundries normally use a very conservative (thin) SRAF width everywhere on the layout, instead of using thin SRAFs only where needed.

Prior art techniques determine the SRAF width to use in a layout by first placing a number of SRAFs of varying dimensions on a test layout. Next, the layout is manufactured and the largest SRAF size that does not print anywhere on the wafer can be chosen as the SRAF width for all locations. However, this technique for determining SRAF widths results in widths that are too conservative (i.e., overly thin SRAFs) which substantially limits the efficacy of SRAFs.

One embodiment of the present invention allows designers to precisely determine the maximum SRAF width which will not print on the wafer. This aspect of the present invention allows designers to unleash the full power of SRAFs.

Process models which are determined using prior art techniques cannot accurately determine whether an SRAF will print. In particular, prior art process models usually cannot accurately model the optical intensity in the proximity of an SRAF. Since the optical intensity is not modeled accurately, prior art process models cannot accurately determine whether an SRAF will print.

The accuracy of a process model depends on, inter alia, the empirical data which is used for fitting the process model. In prior art techniques, empirical process data is usually obtained by exposing a layout at a normal exposure level because the process model is intended to model the semiconductor manufacturing processes under normal operating conditions. However, under normal operating conditions, SRAFs do not print (that's why they are called sub-resolution assist features). Hence, in prior art techniques, the empirical data usually does not contain any data that can be used to calibrate or fit the process model in the proximity of SRAFs.

Further, note that prior art techniques cannot change the exposure level during empirical data collection because then the fitted process model will not model the semiconductor manufacturing processes under normal operating conditions.

However, as mentioned before, accurately determining whether an assist feature will print is important because it allows designers to fully utilize the power of assist features to increase the through process window.

One embodiment of the present invention substantially improves the accuracy of process models for predicting when SRAFs will print by obtaining empirical data at multiple exposure levels and by fitting the empirical data to a single process model.

Determining a Process Model to Predict Whether an SRAF will Print

Figure 4:
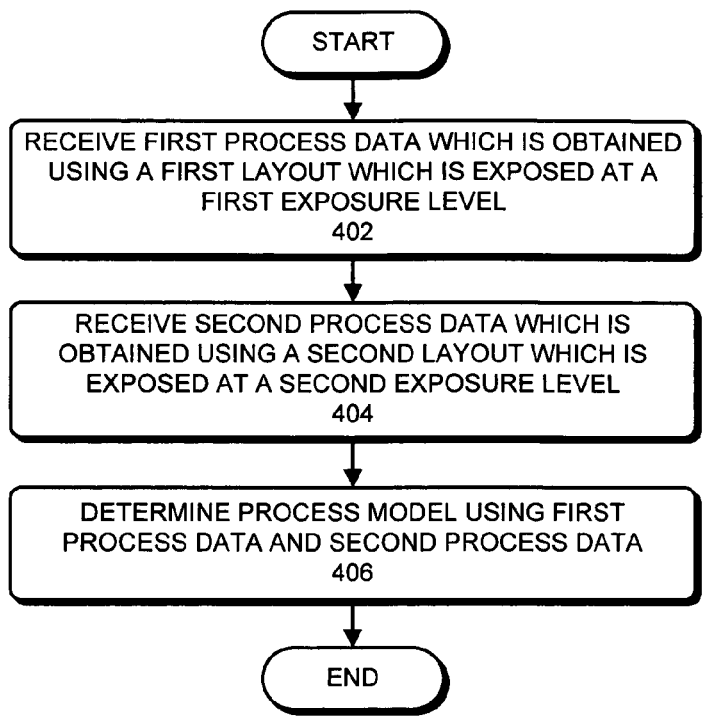
FIG. 4 presents a flowchart that illustrates a process for determining a process model which can accurately predict whether an assist feature will print in accordance with an embodiment of the present invention.

FIG. 4 presents a flowchart that illustrates a process for determining a process model which can accurately predict whether an assist feature will print in accordance with an embodiment of the present invention.

The process usually begins by receiving first process data which is obtained using a first layout which is exposed at a first exposure level (step 402).

The first exposure level can be the normal exposure level. Note that at the normal exposure level SRAFs usually don't print.

The first process data can comprise empirical data which was obtained by measuring critical dimensions of features which are intended to be printed under normal exposure levels. Since SRAFs usually do not print under normal exposure levels, the first process data usually does not contain critical dimension measurements of SRAFs.

Next, the system receives second process data which is obtained using a second layout which is exposed at a second exposure level (step 404).

The second exposure level can be different from the first exposure level. Furthermore, the second exposure level can cause the sub-resolution assist features in the second layout to print. Specifically, in a clear field process, the second exposure level can be less than the first exposure level, whereas in a dark field process, the second exposure level can be greater than the first exposure level.

The second process data can comprise empirical data which was obtained by measuring critical dimensions of SRAFs which were forced to print using the second exposure level.

The system then determines a process model using the first process data and the second process data (step 406). Specifically, the system determines the process model by fitting a process model to the first process data and the second process data.

Note that prior art techniques cannot fit a process model to the first process data and the second process data because these data sets are obtained using different exposure levels. In other words, prior art techniques only use empirical data that was obtained using a single exposure level.

In contrast, embodiments of the present invention use empirical data that was obtained using multiple exposure levels. Embodiments of the present invention can use empirical data obtained from multiple exposure levels because of the following insight: process data obtained using different exposure levels can be fit to the same process model by adjusting the appropriate parameters in the process model to reflect the different exposure energy levels.

Specifically, if the process model comprises a normalized optical intensity component and a threshold, the system can fit the second process data along with the first process data by adjusting the threshold parameter using the following expression:

$$T_2 = \left(\frac{E_2}{E_1}\right) \cdot T_1,$$

where $T_1$ is the threshold for fitting the first process data, $T_2$ is the threshold for fitting the second process data, $E_1$ is the first exposure energy level, and $E_2$ is the second exposure energy level.

The fitted process model has a single threshold value. However, during fitting, second process data is adjusted by a factor of $E_2/E_1$, to reflect the difference in the exposure energy levels.

Note that, in this example, the threshold varies linearly with the exposure energy level because the threshold is associated with the sensitivity of the photoresist, and because the optical intensity component is normalized.

The present invention is not limited to fitting only the threshold parameter. Specifically, techniques and systems described in the instant application can be used to fit any parameter, e.g., defocus, numerical aperture, etc., to process data which is obtained at different process points (e.g., using multiple exposure levels).

To reiterate, embodiments of the present invention do not fit two separate process models. Instead, a single process model is fitted using multiple sets of empirical data which were obtained using different exposure levels.

An important aspect of the present invention is that it accurately models the optical intensity in the proximity of SRAFs at exposure levels at which the SRAFs usually do not print. In contrast, prior art techniques do not accurately model the optical intensity in the proximity of SRAFs at exposure levels at which the SRAFs usually do not print.

Furthermore, prior art techniques may generate process models which do not extrapolate well to different process points. In prior art techniques, a process model is fit to empirical data which is usually obtained for a certain process point (i.e., under certain process conditions). Hence, prior art process models may not work accurately under different process conditions, e.g., under defocus or a different exposure energy. In contrast, process models generated using the present invention may extrapolate well across different process points because the process model is fit to empirical data which is obtained at different process points, e.g., using multiple exposure levels.

Determining Whether an SRAF will Print

Figure 5:
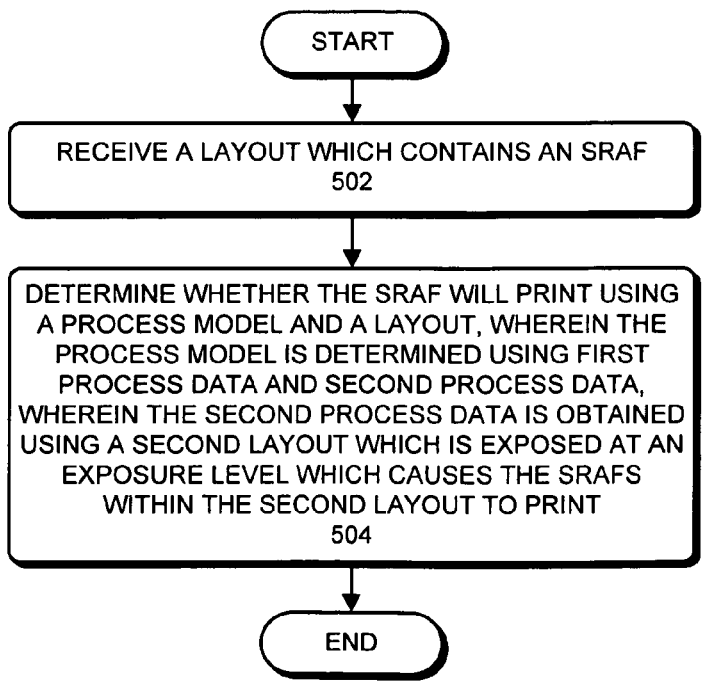
FIG. 5 presents a flowchart that illustrates a process for determining whether an SRAF will print in accordance with an embodiment of the present invention.

FIG. 5 presents a flowchart that illustrates a process for determining whether an SRAF will print in accordance with an embodiment of the present invention.

The process typically begins by receiving a layout which contains an SRAF (step 502).

The system then determines whether an SRAF will print using a process model and the layout (step 504).

As explained above, in contrast to prior art techniques, the process model is determined using at least two sets of process data. A first process data can be obtained using a first layout which is exposed at a first exposure level, and a second process data can be obtained using a second layout which is exposed at a second exposure level. The second exposure level can force the SRAFs within the second layout to print. The first exposure level can be the normal exposure level which is used by the semiconductor manufacturing processes under normal operating conditions.

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), or any device capable of storing data usable by a computer system.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art.

For example, although the present invention is described in the context of sub-resolution assist features, the present invention can be used to predict when other non-printing shapes in a layout will print. Furthermore, the present invention can also be used for determining an accurate process model for super-resolution features.

In addition, embodiments of the present invention can be used during each of five steps in the assist feature placement process, namely, generation of placement rules, initial SRAF placement, resolution of MRC (Mask Rule Check) violations and other rule violations, post-placement adjustment of assist features and verification of assist feature effectiveness.

The above disclosure is not intended to limit the present invention. The scope of the present invention is defined by the appended claims.

What is claimed is:

1. A method for determining whether a sub-resolution assist feature will print, the method comprising:
   receiving a layout which contains a sub-resolution assist feature;
   determining an aerial image intensity which involves convolving the layout with a process model which is fitted using first process data and second process data, wherein the first process data is obtained by measuring critical-dimensions of printed patterns which are printed by exposing a test layout using a first exposure level, wherein the second process data is obtained by measuring critical-dimensions of printed patterns which are printed by exposing the test layout using a second exposure level, and wherein a ratio between the first exposure level and the second exposure level is used to fit the process model; and
   determining whether the sub-resolution assist feature will print by comparing the aerial image intensity with a threshold.

2. The method of claim 1,
   wherein in a clear field process, the second exposure level is less than the first exposure level;
   wherein in a dark field process, the second exposure level is greater than the first exposure level.

3. A computer-readable storage medium storing instructions that when executed by a computer cause the computer to perform a method for determining whether a sub-resolution assist feature will print, the method comprising:
   receiving a layout which contains a sub-resolution assist feature;

determining an aerial image intensity which involves convolving the layout with a process model which is fitted using first process data and second process data, wherein the first process data is obtained by measuring critical-dimensions of printed patterns which are printed by exposing a test layout using a first exposure level, wherein the second process data is obtained by measuring critical-dimensions of printed patterns which are printed by exposing the test layout using a second exposure level, and wherein a ratio between the first exposure level and the second exposure level is used to fit the process model; and determining whether the sub-resolution assist feature will print by comparing the aerial image intensity with a threshold.

4. The computer-readable storage medium of claim 3, wherein in a clear field process, the second exposure level is less than the first exposure level;

wherein in a dark field process, the second exposure level is greater than the first exposure level.

5. A method for determining a fitted process model, the method comprising:

receiving first process data which is obtained by measuring critical-dimensions of printed patterns which are printed by exposing a layout using a first exposure level;

receiving second process data which is obtained by measuring critical-dimensions of printed patterns which are printed by exposing the layout using a second exposure level which is different from the first exposure level;

determining a ratio between the first exposure level and the second exposure level; and determining a fitted process model by fitting a process model to the first process data and the second process data using the ratio.

6. The method of claim 5, wherein the second exposure level causes the sub-resolution assist features within the layout to print.

7. The method of claim 5, wherein in a clear field process, the second exposure level is less than the first exposure level;

wherein in a dark field process, the second exposure level is greater than the first exposure level.

8. The method of claim 5, wherein fitting the process model involves adjusting data values in the second process data using the ratio.

9. A computer-readable storage medium storing instructions that when executed by a computer cause the computer to perform a method for determining a fitted process model, the method comprising:

receiving first process data which is obtained by measuring critical-dimensions of printed patterns which are printed by exposing a layout using a first exposure level;

receiving second process data which is obtained by measuring critical-dimensions of printed patterns which are printed by exposing the layout using a second exposure level which is different from the first exposure level;

determining a ratio between the first exposure level and the second exposure level; and determining a fitted process model by fitting a process model to the first process data and the second process data using the ratio.

10. The computer-readable storage medium of claim 9, wherein the second exposure level causes the sub-resolution assist features within the layout to print.

11. The computer-readable storage medium of claim 9, wherein in a clear field process, the second exposure level is less than the first exposure level;

wherein in a dark field process, the second exposure level is greater than the first exposure level.

12. The computer-readable storage medium of claim 9, wherein fitting the process model involves adjusting data values in the second process data using the ratio.

* * * * *